United States Patent
Chilappagari et al.

(10) Patent No.: US 10,365,966 B1
(45) Date of Patent: Jul. 30, 2019

(54) METHODS AND SYSTEMS FOR WORDLINE BASED ENCODING AND DECODING IN NAND FLASH

(71) Applicant: Marvell International Ltd., Hamilton (BM)

(72) Inventors: Shashi Kiran Chilappagari, San Jose, CA (US); Viet-Dzung Nguyen, San Jose, CA (US); Gregory Burd, San Jose, CA (US)

(73) Assignee: Marvell International Ltd., Hamilton (BM)

(*) Notice: Subject to any disclaimer, the term of this patent is extended or adjusted under 35 U.S.C. 154(b) by 185 days.

(21) Appl. No.: 14/668,319

(22) Filed: Mar. 25, 2015

Related U.S. Application Data

(60) Provisional application No. 61/970,130, filed on Mar. 25, 2014.

(51) Int. Cl.
   *G11C 29/00* (2006.01)
   *G06F 11/10* (2006.01)
   *H03M 13/11* (2006.01)

(52) U.S. Cl.
   CPC ..... *G06F 11/1008* (2013.01); *H03M 13/1105* (2013.01)

(58) Field of Classification Search
   CPC ...... G06F 11/00; G06F 11/10; G06F 11/1008; G06F 11/1072; G06F 11/3404; G06F 12/02; G06F 3/06; G06F 3/0619; G06F 3/0656; G06F 3/0688; G06F 9/3822; G11C 29/00; G11C 29/52; H03M 13/05; H03M 13/1105; H03M 13/15; H03M 13/29

See application file for complete search history.

(56) References Cited

U.S. PATENT DOCUMENTS

| | | | | |
|---|---|---|---|---|
| 5,365,601 A * | 11/1994 | Kadakia | ............ | G06T 3/60 345/658 |
| 5,768,215 A * | 6/1998 | Kwon | ............ | G11C 7/1021 365/185.12 |
| 6,173,330 B1 * | 1/2001 | Guo | ............ | H04N 5/4401 341/81 |
| 2002/0118567 A1 * | 8/2002 | Takagi | ............ | G11C 7/1036 365/185.11 |
| 2004/0225946 A1 * | 11/2004 | Hashimoto | ............ | G06F 11/1008 714/764 |
| 2005/0268208 A1 * | 12/2005 | Shimizume | ............ | G06F 11/1068 714/763 |
| 2008/0094893 A1 * | 4/2008 | Choi | ............ | G06F 11/1072 365/185.03 |
| 2010/0259983 A1 * | 10/2010 | Yoon | ............ | G11C 11/5628 365/185.12 |
| 2011/0119432 A1 * | 5/2011 | Yoon | ............ | G11C 7/1006 711/103 |
| 2011/0209028 A1 * | 8/2011 | Post | ............ | G06F 11/1068 714/758 |

(Continued)

*Primary Examiner* — Albert Decady
*Assistant Examiner* — Enamul M Kabir

(57) ABSTRACT

Systems and methods are disclosed for storing codewords in NAND memory. The method includes receiving a first and second codeword. The method includes storing a partition of the first codeword and a partition of the second codeword in a buffer. The method includes transferring the partition of the first codeword and the partition of the second codeword to a page in NAND memory.

18 Claims, 10 Drawing Sheets

(56) References Cited

U.S. PATENT DOCUMENTS

| | | | |
|---|---|---|---|
| 2012/0069657 A1* | 3/2012 | Choi | G11C 11/5621 365/185.09 |
| 2012/0311388 A1* | 12/2012 | Cronin | G06F 11/1004 714/42 |
| 2013/0179753 A1* | 7/2013 | Flynn | G06F 12/0253 714/773 |
| 2014/0122973 A1* | 5/2014 | Motwani | H03M 13/1105 714/773 |
| 2015/0193157 A1* | 7/2015 | Hwang | G11C 16/06 714/764 |

* cited by examiner

| 210 | 220 |

| 212 | 214 | 216 | 222 | 224 | 226 |

| 230 | 240 |  | 232 | 234 | 236 | 242 | 244 | 246 |

| 250 | 260 |

| 252 | 254 | 256 | 262 | 264 | 266 |

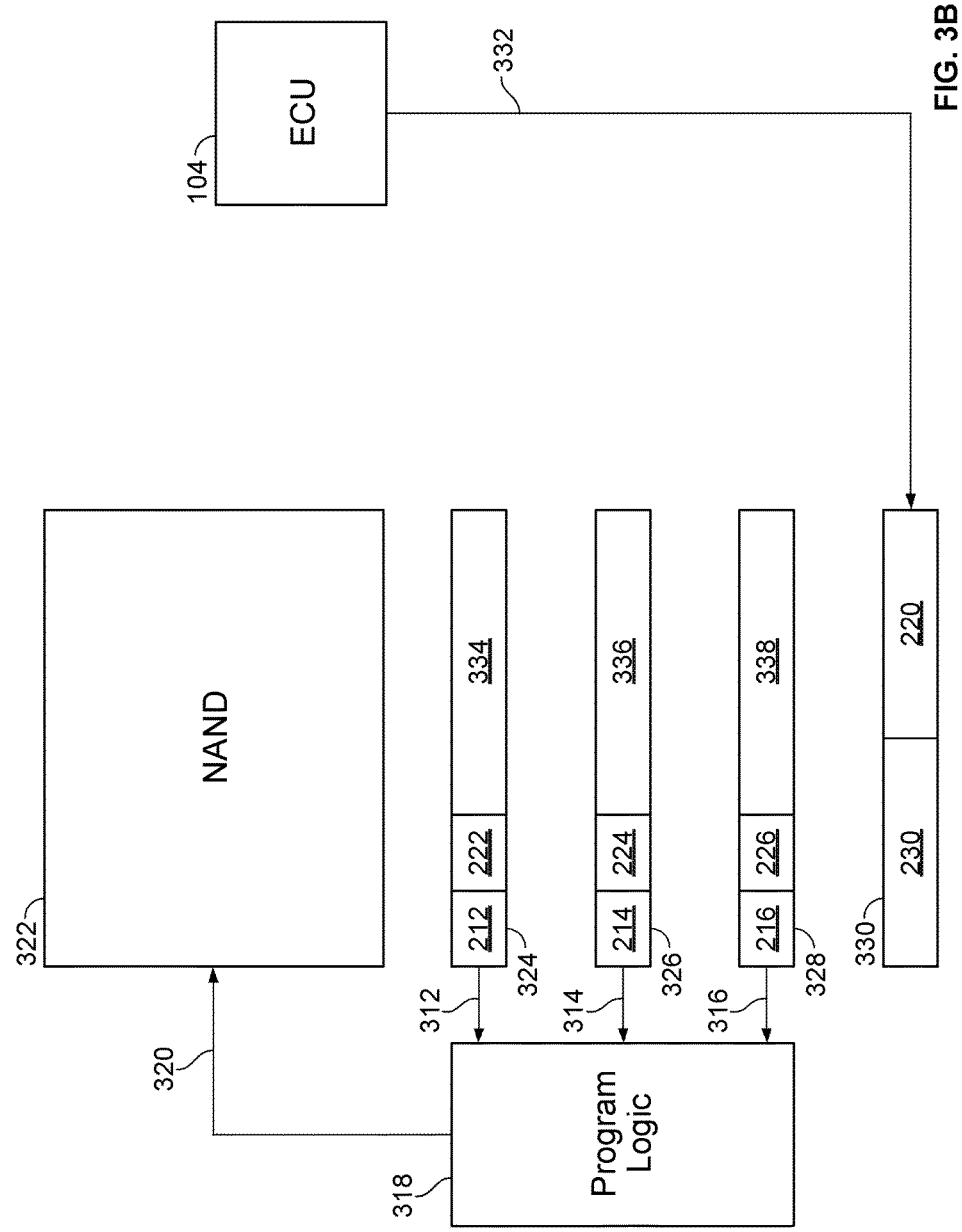

METHODS AND SYSTEMS FOR WORDLINE BASED ENCODING AND DECODING IN NAND FLASH

CROSS REFERENCE TO RELATED APPLICATION

This disclosure claims the benefit under 35 U.S.C. § 119(e) of U.S. Provisional Application No. 61/970,130, filed Mar. 25, 2014, which is incorporated by reference in its entirety.

FIELD OF USE

This disclosure relates to methods and systems for writing codewords to and reading codewords from NAND Flash memory.

BACKGROUND OF THE DISCLOSURE

The background description provided herein is for the purpose of generally presenting the context of the disclosure. Work of the inventors hereof, to the extent the work is described in the background section, as well as aspects of the description that may not otherwise qualify as prior art at the time of filing, are neither expressly or impliedly admitted as prior art against the present disclosure.

In conventional NAND Flash memory based systems, data is stored in NAND Flash memory through a two-step process. In the first step, an Error Correcting Unit (ECU) receives raw data and encodes it such that errors in the data can be detected, and in some embodiments, fixed. This allows the data to be checked for accuracy when it is read from the NAND memory at a later time. The ECU then transfers the encoded data, in the form of codewords, to a page register associated with the NAND memory. For example, the ECU may transfer a first codeword and a second codeword, one at a time, to the page register. The page register is a buffer that stores the encoded data until it can be stored in the NAND memory. For example, the page register may store the entire first codeword, followed by the entire second codeword.

In the second step, also referred to as the programming step, the encoded data is transferred from the page register to the NAND memory. The page register may transfer its entire contents to a page in the NAND memory in one step. For example, the page register may transfer the first codeword and the second codeword to a page in the NAND memory, so the page in the NAND memory can store the first codeword and the second codeword in the same format that they were stored in the page register. The second step can often be more time consuming than the first step. Hence, it may be desirable to reduce the time and complexity associated with the programming step.

The codewords stored in the NAND memory may accumulate errors over time. These errors may be created due to the physical structure of the NAND memory, as well as the continued use of the NAND memory. Different pages in the NAND memory may be associated with different error rates. It may be desirable to reduce the error rate for the encoded data as a whole.

SUMMARY

In accordance with an embodiment of the present disclosure, a method is provided for storing codewords in NAND memory. The method may include receiving a first and a second codeword, wherein a codeword includes an encoded data unit. The method may include storing a partition of the first codeword and a partition of the second codeword in a buffer. The method may include transferring the partition of the first codeword and the partition of the second codeword to a page.

One or more implementations of the present disclosure may provide the one or more of the following advantages. In some implementations, the method may include using a chopping logic controller to reformat the first codeword into a first and a second partition of the first codeword. In some implementations, the method may include receiving the first and second codeword at an extra buffer. In some implementations, the method may include transferring the partition of the first codeword to the page using a permutor, which may be a cyclic shifter. In some implementations, the method may include selecting the page using program logic. In some implementations, the method may include transferring a second partition of the first codeword to the page in response to determining the Raw Bit Error Rate (RBER) of the page is almost equal to the RBER of another page. In some implementations, the method may include transferring the partition of the first codeword from the page to an Error Correction Unit (ECU). In some implementations, the method may include storing a first partition of the first codeword and a second partition of the first codeword across different pages in different planes, or across different pages in different Logical Unit Numbers (LUNs).

In accordance with an embodiment of the present disclosure, a system is provided for storing codewords in NAND memory. The system may include storage circuitry configured to store partitions in a page. The system may include control circuitry configured to receive a first and a second codeword, wherein a codeword includes an encoded data unit. The system may include control circuitry configured to store a partition of the first codeword and a partition of the second codeword in a buffer. The system may include control circuitry configured to transfer the partition of the first codeword and the partition of the second codeword to a page.

One or more implementations of the present disclosure may provide the one or more of the following advantages. In some implementations, the system may include control circuitry configured to use a chopping logic controller to reformat the first codeword into a first and a second partition of the first codeword. In some implementations, the system may include control circuitry configured to receive the first and second codeword at an extra buffer. In some implementations, the system may include control circuitry configured to transfer the partition of the first codeword to the page using a permutor, which may be a cyclic shifter. In some implementations, the system may include control circuitry configured to select the page using program logic. In some implementations, the system may include control circuitry configured to transfer a second partition of the first codeword to the page in response to determining the (RBER) of the page is almost equal to the RBER of another page. In some implementations, the system may include control circuitry configured to transfer the partition of the first codeword from the page to an Error Correction Unit (ECU). In some implementations, the system may include control circuitry configured to store a first partition of the first codeword and a second partition of the first codeword across different pages in different planes, or across different pages in different Logical Unit Numbers (LUNs).

BRIEF DESCRIPTION OF THE DRAWINGS

Further features of the disclosure, its nature, and various advantages, will be apparent upon consideration of the following detailed description, taken in conjunction with the accompanying drawings, in which:

FIG. 3B shows a transfer of codewords from an Error Correcting Unit to NAND memory using an extra buffer, in accordance with an embodiment of the present disclosure;

DETAILED DESCRIPTION

To provide an overall understanding of the disclosure, certain illustrative embodiments will now be described, including methods and systems for wordline based encoding and decoding in NAND Flash. However, the methods and systems described herein may be adapted and modified as is appropriate for the application being addressed, and the methods and systems described herein may be employed in other suitable applications.

Figure 1:
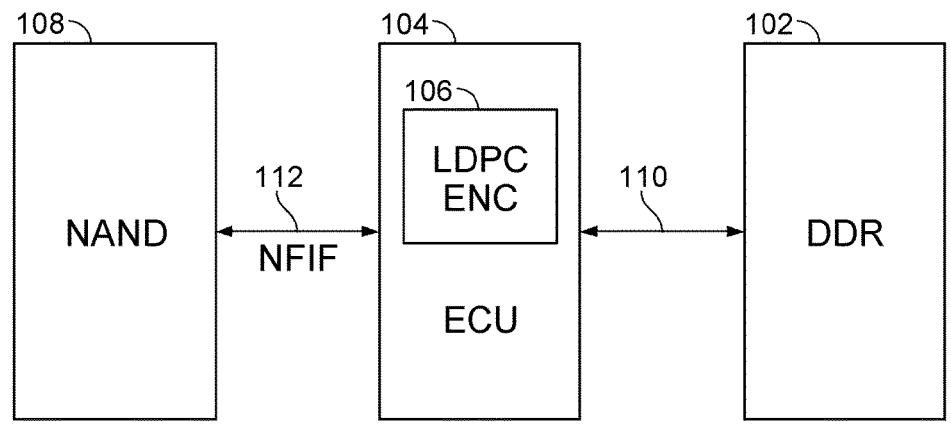
FIG. 1 shows an illustrative block diagram of NAND Flash systems that may be used in accordance with an embodiment of the present disclosure.

FIG. 1 shows an illustrative block diagram of NAND Flash systems that may be used in accordance with an embodiment of the present disclosure. This block diagram illustrates the flow of data that may occur from Double Data Rate (DDR) 102 to Error Correcting Unit (ECU) 104 to NAND memory 108 while writing data to NAND memory 108. The block diagram also represents the flow of data that may occur from NAND memory 108 to ECU 104 to DDR 102 when reading data from NAND memory 108.

DDR 102 begins the process of writing to NAND memory 108 by initiating transfer of data to NAND memory 108. DDR 102 may be an integrated circuit that controls the transfer of data to NAND memory 108. DDR 102 may transfer data to ECU 104 through data path 110 using a clock signal for synchronization. A data path may be any channel capable of transferring data from a source location to a destination location. In some embodiments, other data transfer systems like Single Data Rate (SDR) may be used. In some embodiments, DDR 102 may operate on the granularity of host sectors. That is, DDR 102 may transfer the contents of a host sector to ECU 104 using data path 110.

ECU 104 may receive data from DDR 102 through data path 110 and encode it to make error detection possible. ECU 104 may encode data by adding bits to it that make it possible to check if the data has been corrupted. Data may be corrupted when bits that comprise the data are accidentally flipped from "0" to "1" or vice versa during the processes of storage and transfer of the data. The encoding performed by ECU 104 may make it possible to detect and, in some cases, reverse these errors. In some embodiments, ECU 104 may decode codewords back into data during the process of reading data from NAND memory 108. In some embodiments, ECU 104 may operate on the granularity of Allocation Units (AUs). That is, ECU 104 may encode raw data into codewords one AU at a time. These allocation units may be the smallest possible space that can be allocated in NAND memory 108. In some embodiments, an AU may be comprised of multiple codewords. In some embodiments, ECU 104 may not be capable of buffering data. That is, ECU 104 may transfer data to NAND memory 108 as soon as it is encoded.

ECU 104 may encode data by using Low Density Parity Check Encoding (LDPC ENC) 106. LDPC ENC is an encoding mechanism that adds efficient error checking code to data. LDPC ENC may encode the received data from DDR 102 into codewords. Codewords may comprise the received data and added error checking code. In some embodiments, other encoding mechanisms may be used by ECU 104. Errors may occur in the data stored in NAND memory 108 because of unpredictable bit flipping that may cause "0"s stored in the memory to change to "1"s and vice versa. These errors may occur due to the physical structure of NAND memory 108 and its continued usage. Errors may also occur in the data and codewords as they are being transferred through data paths. Error checking code may help ECU 104 detect these errors. In some embodiments, LDPC ENC 104 may be an Encoder and Decoder (ENDEC) system. That is, LDPC ENC 104 may be capable of encoding data into codewords, and decoding codewords into data. In some embodiments, decoding codewords into data may comprise detecting and reversing errors in the data.

ECU 104 may transfer codewords to NAND memory 108 through NAND Flash Interface (NFIF 112). NFIF 112 is a data path capable of transferring data to NAND memory 108. NAND memory 108 may be a non-volatile memory that does not require power to retain information, and may be referred to as NAND Flash. NAND memory 108 may be a type of Flash memory. In some embodiments, NAND memory 108 may operate on the granularity of pages. That is, data may be written to or read from NAND memory 108 page by page. In some embodiments, NAND memory 108 may comprise page buffers, also referred to as buffers in this disclosure. These page buffers may receive pages of codewords from ECU 104 through NFIF 112 and then transfer the received codewords to pages in NAND memory 108. Although page buffers are discussed in this application as being the size of two codewords, it is understood that page buffers may be the size of any number of codewords. In some embodiments, page registers in NAND memory 108 may act as page buffers. Similarly, though NAND memory is discussed in this application as having two or three pages, it is understood that NAND memory may have any number of pages.

In some embodiments, NAND memory may have two pages. In this situation, the two pages may be referred to as an upper page and a lower page, and may together be referred to as a wordline. In some embodiments, NAND memory may have three pages. In this situation, the three pages may be referred to as an upper page, a middle page, and a lower page, and may together be referred to as a wordline.

Transfer of data from ECU 104 to NAND memory 108 using NFIF 112 may be comprised of two steps. In the first step, codewords may be transferred from ECU 104 to page buffers associated with NAND memory 108 using NFIF 112. In the second step, codewords may be transferred from page buffers associated with NAND memory 108 to NAND memory 108 using data paths internal to NAND memory 108. The second step may be referred to as "programming" NAND memory 108 or writing to NAND memory 108. In some embodiments, the second step may consume more time than the first step. In some embodiments, a page may be transferred from ECU 104 to page buffers associated with NAND memory 108, and then programmed into NAND memory 108. In some embodiments, a first page may be transferred from ECU 104 to page buffers associated with NAND memory 108, while a second page may be simultaneously programmed into NAND memory 108.

In some embodiments, NAND memory 108 may be organized such that a set of pages may form a block. In some embodiments, NAND memory 108 may be organized such that a set of blocks may form a plane. In some embodiments, NAND memory 108 may be organized such that a set of planes form a Logical Unit Number (LUN). In some embodiments, NAND memory 108 may be organized such that a set of LUNs form a target.

The process of reading data from NAND memory 108 may comprise transferring codewords from NAND memory 108 to ECU 104 using NFIF 112, and transferring data from ECU 104 to DDR 102 using data path 110. NAND memory 108, ECU 104, and DDR 102 may comprise control circuitry configured to perform the writing and reading of data and codewords described in this disclosure. NAND memory 108 may comprise storage circuitry configured to store codewords as described in this disclosure.

Figure 2:
FIG. 2 shows six codewords reformatted into three partitions each, in accordance with an embodiment of the present disclosure.

FIG. 2 shows six codewords reformatted into three partitions each, in accordance with an embodiment of the present disclosure. Codeword 210 is reformatted into partitions 212, 214, and 216. Codeword 220 is reformatted into partitions 222, 224, and 226. Codeword 230 is reformatted into partitions 232, 234, and 236. Codeword 240 is reformatted into partitions 242, 244, and 246. Codeword 250 is reformatted into partitions 252, 254, and 256. Codeword 260 is reformatted into partitions 262, 264, and 266.

Reformatting may split codeword 210 into smaller partitions 212, 214, and 216. Reformatting codeword 210 into partitions 212, 214, and 216 may not modify the content of codeword 210. The reformatting may make codeword 210 suited to be stored across different pages in NAND memory 108 since each of the partitions 212, 214, and 216 may be capable of being stored in a different respective page in NAND memory 108. Each partition may be of an equal size, or may have different sizes when compared to the other partitions. Reformatting the codewords into partitions may happen in ECU 104, in buffers associated with NAND memory 108, or in a chopping logic controller or permutor as discussed below.

The reformatting of codewords 210, 220, 230, 240, 250, and 260 may have several advantages. Different pages of NAND memory 108 may have different Raw Bit Error Rates (RBER). RBER is a value used to measure and describe the accuracy of digital transmission, and it may be desirable to improve the RBER associated with the codewords to improve the accuracy of digital transmission. A codeword stored in a page with high RBER may be associated with a high RBER, while a codeword stored in a page with low RBER may be associated with a low RBER. For example, NAND memory 108 may have three pages for each wordline: an upper page, a middle page, and a lower page. NAND memory 108 may have worse RBER associated with the upper pages than the lower pages in each wordline. In this situation, storing codeword 210 in an upper page may result in a worse RBER associated with codeword 210, than if partition 212 of codeword 210 was stored in the upper page, and partitions 214 and 216 were stored in a middle page and a lower page, respectively. Storing partitions of all codewords across different pages in NAND memory 108 may lead to an average of the RBER of the different pages being associated with all the codewords as a whole, avoiding a situation where certain codewords are associated with a worse RBER than other codewords. This may be an optimal strategy to store all codewords, as it may result in the lowest possible RBER for the combined set of all codewords.

Although this disclosure discusses the NAND memory 108 as having two or three pages, it is understood that NAND memory 108 may comprise any number of pages. Although this disclosure discusses the codewords being reformatted into two or three partitions each, it is understood that a codeword may be reformatted into any number of partitions. For example, codeword 210 may be reformatted into four or five partitions.

Storing partitions of reformatted codewords in NAND memory 108 may require NAND memory 108 to have certain properties. In some embodiments, NAND memory 108 may require all pages of a wordline to be available before a programming step is triggered. The pages of the wordline may be made available to NAND memory 108 by being stored in buffers. In some embodiments, NAND memory 108 may transfer all pages of a wordline to NAND memory 108 in one step. In some embodiments, NAND memory 108 may require more than one step to transfer all pages of a wordline to NAND memory 108. In some embodiments, NAND memory 108 may allow each page of a wordline to be read independently.

Reformatting codewords into partitions may be done at many locations during the transfer of codewords from ECU 104 to NAND memory 108. In some embodiments, reformatting codewords into partitions may be done by ECU 104. In some embodiments, reformatting codewords into partitions may be done when ECU 104 transfers codewords using NFIF 112. In some embodiments, reformatting codewords into partitions may be done when codewords are stored into buffers. In some embodiments, reformatting codewords into partitions may be done when codewords are being programmed into NAND memory 108 from the buffers. Codewords may be reformatted into partitions as described here in relation with any of the embodiments in this disclosure.

Figure 3A:
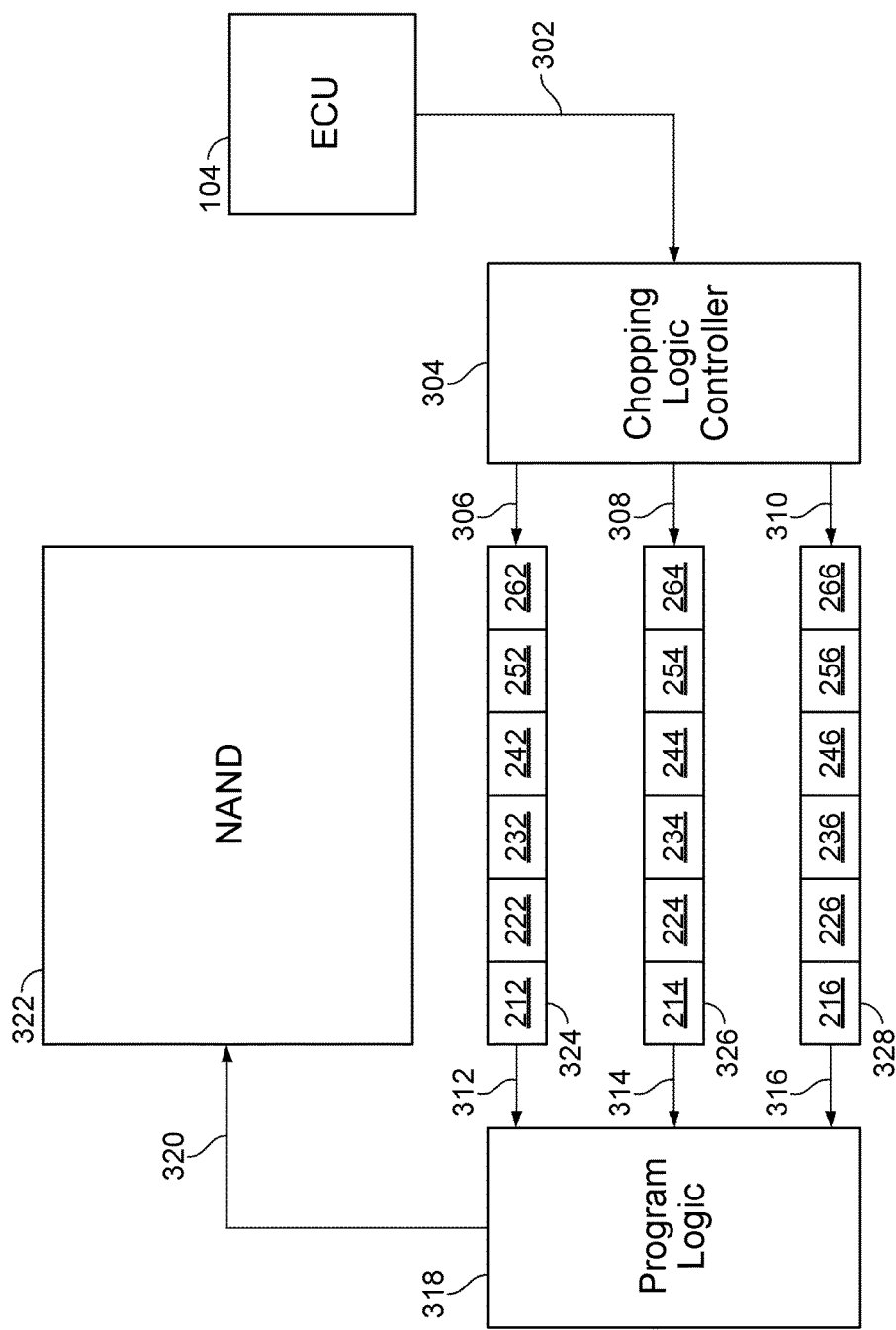
FIG. 3A shows a transfer of codewords from an Error Correcting Unit to NAND memory using a chopping logic controller, in accordance with an embodiment of the present disclosure.

FIG. 3A shows a transfer of codewords from ECU 104 to NAND memory 322 using a chopping logic controller, in accordance with an embodiment of the present disclosure. This embodiment may use chopping logic controller 304. Chopping logic controller 304 may receive codewords 210, 220, 230, 240, 250, and 260 from ECU 104 through data path 302. Data path 302 may be a part of NFIF 112. Chopping logic controller 304 may reformat the received codewords so that the output of chopping logic controller 304 is partitions arranged in a desired layout. The partitions may then be transferred to page buffers.

Chopping logic controller 304 may transfer its output to upper page buffer 324, middle page buffer 326, and lower page buffer 328. Chopping logic controller 304 may use data paths 306, 308, and 310 to transfer its output to the page buffers. Data paths 306, 308, and 310 may be parts of NFIF 112. In some embodiments, chopping logic controller 304 may only be able to use one of the data paths 306, 308, and 310 at any given time.

In some embodiments, chopping logic controller 304 may transfer its output in a layout that stores each partition of a codeword in a different buffer. For example, the layout depicted in FIG. 3A shows that the partitions of codeword 210 are stored such that partition 212 is stored on upper buffer 324, partition 214 is stored on middle buffer 326, and partition 216 is stored on lower buffer 328. Similarly, the partitions of codeword 220 are stored such that partition 222 is stored on upper buffer 324, partition 224 is stored on middle buffer 326, and partition 226 is stored on lower buffer 328. The partitions of codewords 230, 240, 250, and 260 are similarly stored so that only one partition of each codeword is stored in each buffer.

In some embodiments, chopping logic controller 304 may only use one of data paths 306, 308, and 310 at any given time to create the layout shown in FIG. 3A. For example, chopping logic controller may receive codewords 210, 220, 230, 240, 250, and 260 from ECU 104 through data path 302 and output partitions 212, 222, 232, 242, 252, and 262 to upper buffer 324 using data path 306. In some embodiments, chopping logic controller 304 may not have any memory to store the received codewords. Hence, chopping logic controller 304 may again receive codewords 210, 220, 230, 240, 250, and 260 from ECU 104 through data path 302 and output partitions 214, 224, 234, 244, 254, and 264 to middle buffer 326 using data path 308. Finally, chopping logic controller 304 may yet again receive codewords 210, 220, 230, 240, 250, and 260 from ECU 104 through data path 302 and output partitions 216, 226, 236, 246, 256, and 266 to lower buffer 328 using data path 310.

After the partitions of all codewords have been stored in buffers 324, 326, and 328, they can be transferred to NAND memory 322. Transferring partitions to NAND memory 322 may comprise programming NAND memory 322 to store the partitions. In some embodiments, NAND memory 322 may be configured to program a wordline in one step. For example, buffers 324, 326, and 328 may use data paths 312, 314, and 316 respectively to transfer the partitions stored in the buffers to the program logic. Program logic may transfer the contents of buffers 324, 326, and 328 to an upper, middle and lower page respectively of a wordline NAND memory 322 in one step using data path 320.

In some embodiments, NAND memory 322 may be configured to program a wordline one page at a time. NAND memory 322 may require all pages of a wordline to be available before the wordline can be programmed. Each buffer 324, 326, and 328 may correspond to a page in a wordline. Each buffer may be full before the contents of the buffer are transferred to NAND memory 322. Contents of buffer 324 may be transferred to program logic 318 using data path 312. Program logic 318 may select a first page of NAND memory 322 and transfer the contents of buffer 324 to the first page using data path 320. Similarly, contents of buffer 326 may be transferred to program logic 318 using data path 314. Program logic 318 may select a second page of NAND memory 322 and transfer the contents of buffer 326 to the second page using data path 320. Similarly, contents of buffer 328 may be transferred to program logic 318 using data path 316. Program logic 318 may select a third page of NAND memory 322 and transfer the contents of buffer 328 to the third page using data path 320.

A disadvantage of using chopping logic controller 304 in accordance with the embodiments shown in FIG. 3A is that ECU 104 may need to process and transfer each codeword three times, and may need to run at three times the throughput of each of data paths 306, 308, and 310. However, an advantage of using chopping logic controller 304 in accordance with these embodiments is that extra commands are not required for NAND memory 322 and buffers 324, 326, and 328 to store the codewords in NAND memory 322.

In some embodiments, ECU 104 may have direct access to buffers 324, 326, and 328. That is, chopping logic controller 304 may not be used to transfer codewords from ECU 104 to buffers 324, 326, and 328. Instead, data paths 306, 308, and 310 may transfer data from ECU 104 to buffers 324, 326, and 328. ECU 104 may receive commands that allow it to reformat the codewords into partitions, and specify which buffer each partition should be stored in. In some embodiments, ECU 104 may be able to use data paths 306, 308, and 310 simultaneously. For example, ECU 104 may reformat codeword 210 into partitions 212, 214, and 216. ECU 104 may simultaneously transfer partition 212 to buffer 324 using data path 306, partition 214 to buffer 326 using data path 308, and partition 216 to buffer 328 using data path 310. In some embodiments, ECU 104 may only be able to use one of data paths 306, 308, and 310 at any given time. For example, ECU 104 may reformat codeword 210 into partitions 212, 214, and 216. ECU 104 may transfer partition 212 to buffer 324 using data path 306, and then transfer partition 214 to buffer 326 using data path 308, and finally transfer partition 216 to buffer 328 using data path 310.

In some embodiments, ECU 104 may have direct access to buffers 324, 326, and 328 to read data from NAND memory 322 to ECU 104. While reading from NAND memory 322, directions of data paths 306, 308, 310, 312, 314, 316, and 320 may be reversed. A wordline may be read from NAND memory 322 by transferring the data of the wordline from NAND memory 322 to program logic 318 using data path 320. The upper page of the wordline may be stored in upper buffer 324 using data path 312. The middle page of the wordline may be stored in middle buffer 326 using data path 314. The lower page of the wordline may be stored in lower buffer 328 using data path 316.

Partitions may be transferred from buffers 324, 326, and 328 to ECU 104 using data paths 306, 308, and 310 one at a time. For example, partition 212 may be transferred from buffer 324 to ECU 104 using data path 306. Partition 214 may be transferred from buffer 326 to ECU 104 using data path 308. Partition 216 may be transferred from buffer 328 to ECU 104 using data path 310. ECU 104 may then reformat the received partitions 212, 214, and 216 to form codeword 210. A similar process may be followed for the remaining codewords. In some embodiments, partitions 212, 214, and 216 may be transferred simultaneously.

An advantage of not using chopping logic controller 304 may be that extra logic for chopping logic controller 304 no longer needs to be included in NFIF 112. Instead, ECU 104 may need special commands that enable it to reformat codewords into partitions and store the partitions in the appropriate buffers. These special commands may include the need for ECU 104 to perform more than one transfer for a single codeword. A disadvantage of not using chopping logic controller 304 may be that buffers 324, 326, and 328 may need to be configured so they can be written to and read from one partition at a time.

FIG. 3B shows a transfer of codewords from ECU 104 to NAND memory 322 using extra buffer 330, in accordance with an embodiment of the present disclosure. Extra buffer 330 may be configured such that any partition from extra buffer 330 may be able to be transferred to any location in buffers 324, 326, and 328. Extra buffer may receive codewords from ECU 104 through data path 332. Data path 332 may be a part of NFIF 112.

ECU 104 may transfer codeword 230 to extra buffer 330 using data path 332. While this transfer is occurring, extra buffer 330 may reformat codeword 220 into partitions 222, 224, and 226. Extra buffer 330 may transfer the partitions of codeword 220 to buffers 324, 326, and 328 such that partition 222 is stored in upper buffer 324, partition 224 is stored in middle buffer 326, and partition 226 is stored in lower buffer 328. Extra buffer 330 may transfer partitions 222, 224, and 226 to buffers 324, 326, and 328 one at a time, or simultaneously.

After ECU 104 has transferred codeword 230 to extra buffer 330 using data path 332, extra buffer 330 may reformat and transfer partitions of codeword 230 to buffers 324, 326, and 328. For example, extra buffer 330 may reformat codeword 230 into partitions 232, 234, and 236. Extra buffer 330 may transfer the partitions of codeword 230 to the buffers such that partition 232 is stored in upper buffer 324 in empty buffer space 334, partition 234 is stored in middle buffer 326 in empty buffer space 336, and partition 236 is stored in lower buffer 328 in empty buffer space 338. While extra buffer 330 is transferring codeword 230 to buffers 324, 326, and 328, ECU 104 may transfer codeword 240 to the location of codeword 220. After all codewords have been transferred in this manner from ECU 104 to buffers 324, 326, and 328, buffers 324, 326, and 328 of FIG. 3B may contain the same layout of partitions as buffers 324, 326, and 328 of FIG. 3A. The contents of buffers 324, 326, and 328 may be transferred to NAND memory 322 using similar processes as those described with relation to FIG. 3A.

Extra buffer 330 in FIG. 3B is illustrated as being the size of two codewords. This may allow it to simultaneously receive a codeword from ECU 104 using data path 332, and transfer a codeword from extra buffer 330 to buffers 324, 326, and 328. In some embodiments, the size of extra buffer 330 may be reduced so that extra buffer 330 is the size of one codeword. This may be done by configuring extra buffer 330 so that only one transfer is supported at any given time: either a transfer from ECU 104 to extra buffer 330 using data path 332, or a transfer from extra buffer 330 to buffers 324, 326, and 328. In some embodiments, extra buffer 330 may be eliminated by using one of buffers 324, 326, and 328 to act as a pseudo-extra buffer. For example, upper buffer 324 may act as a pseudo-extra buffer. ECU 104 may transfer codewords to pseudo-extra buffer 324, which may, in turn, transfer partitions to buffers 326 and 328. Pseudo-extra buffer 324 may need to be configured to be able to transfer data to any location in buffers 326 and 328.

In some embodiments, extra buffer 330 may be used to read data from NAND memory 322 to ECU 104. While reading from NAND memory 322, directions of data paths 312, 314, 316, 320, and 332 may be reversed. A wordline may be read from NAND memory 322 by transferring the data of the wordline from NAND memory 322 to program logic 318 using data path 320. Pages of NAND memory 322 may be stored in buffers 324, 326, and 328 as described in relation to FIG. 3A.

Partition 222 of buffer 324, partition 224 of buffer 326, and partition 226 of buffer 328 may be transferred to extra buffer 330 and reformatted to form codeword 220. Codeword 220 may be transferred to ECU 104 using data path 332. While codeword 220 is being transferred to ECU 104, codeword 230 may be replaced by codeword 210 in the extra buffer 330. This may be done by transferring partition 212 of buffer 324, partition 214 of buffer 326, and partition 216 of buffer 328 and reformatting them to form codeword 210 to replace codeword 230. After codeword 220 has been transferred to ECU 104, codeword 210 may be transferred to ECU 104 using data path 332.

Extra buffer 330 used to read data from NAND memory 322 to ECU 104 is illustrated as being the size of two codewords so that it can simultaneously support two transfers: a transfer from buffers 324, 326, and 328 to extra buffer 330, and a transfer from extra buffer 330 to ECU 104. Extra buffer 330 may be reduced in size to be the size of one codeword if only one transfer is supported at any given time.

An advantage of the embodiments described in relation to FIG. 3B is that ECU 104 does not need to perform any reformatting of codewords into partitions, or perform multiple transfers for a single codeword. A disadvantage of these embodiments is that extra commands are needed to control both ECU 104 and NAND memory 322 to support the transfer of data to and from extra buffer 330.

Figure 4:
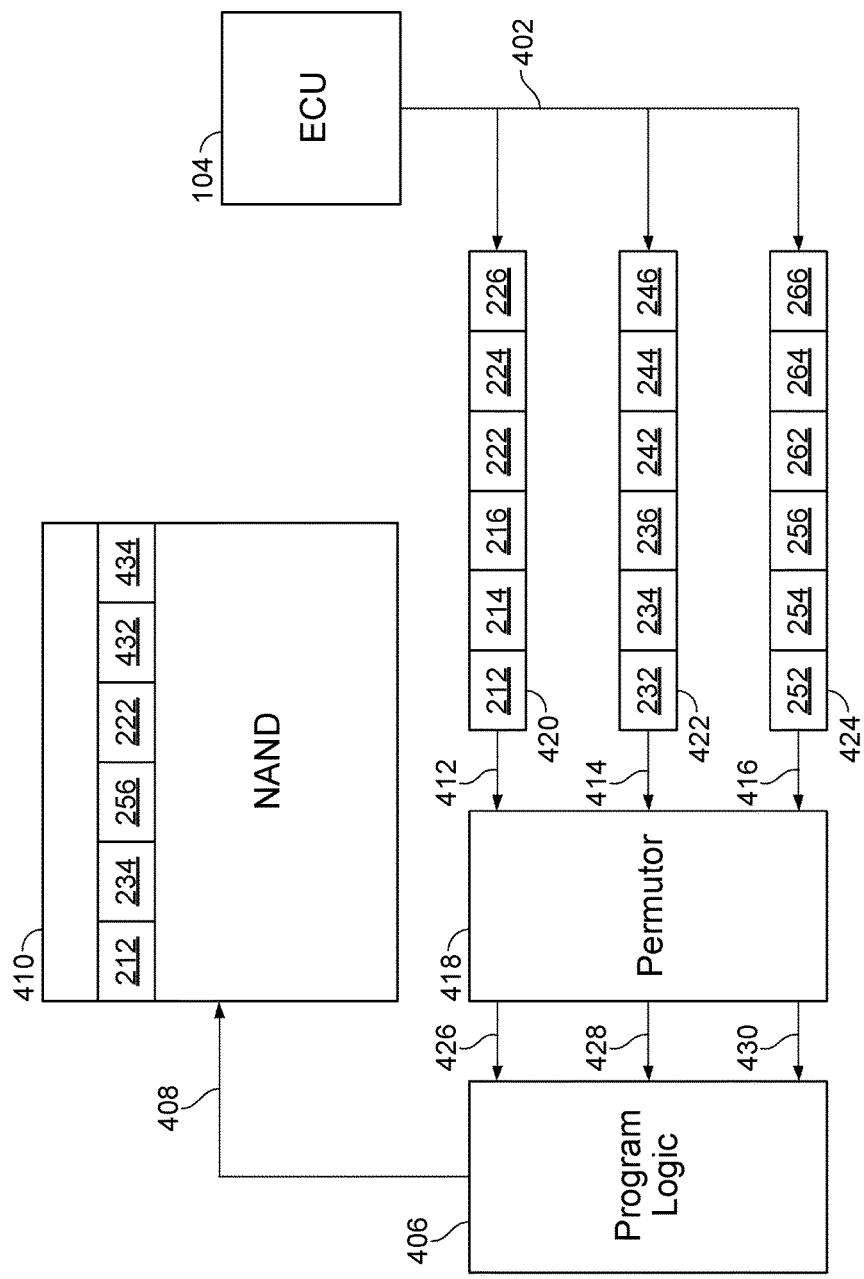
FIG. 4 shows a transfer of codewords from an Error Correcting Unit to NAND memory using a permutor, in accordance with an embodiment of the present disclosure.

FIG. 4 shows a transfer of codewords from ECU 104 to NAND memory 410 using permutor 418, in accordance with an embodiment of the present disclosure. Permutor 418 receives three partitions such that one partition is received through each of data paths 412, 414, and 416. Permutor 418 may rearrange the positions of the received partitions and output them in the shifted positions through data paths 426, 428, and 430. For example, permutor 418 may receive partitions 212, 232, and 252 through data paths 412, 414, and 416 respectively. If permutor 418 did not rearrange the positions of partitions 212, 232, and 252, partition 212 would be output by data path 426, partition 232 would be output by data path 428, and partition 252 would be output by data path 430. However, permutor 418 may rearrange the positions of the received partitions such that partition 212 is output by data path 428, partition 232 is output by data path 430, and partition 252 is output by data path 426. Permutor 418 may rearrange the received partitions in any permutation or pattern. Although in this disclosure permutor 418 is discussed as rearranging three partitions, it is understood that permutor 418 may rearrange the positions of any number of partitions.

ECU 104 may transfer codewords 210, 220, 230, 240, 250, and 260 to buffers 420, 422, and 424 through data path 402. Data path 402 may be part of NFIF 112. After the codewords have been transferred to the buffers, they may be reformatted into partitions. The partitions 212, 214, 216, 222, 224, and 226 may be stored in buffer 412. The partitions 232, 234, 236, 242, 244, and 246 may be stored in buffer 414. The partitions 252, 254, 256, 262, 264, and 266 may be stored in buffer 416.

Permutor 418 may receive the first partition associated with each buffer. For example, permutor 418 may receive partition 212 through data path 412, partition 232 through data path 414, and partition 252 through data path 416. Program logic 406 may be configured to write to an upper page in NAND memory 410 through data path 408. Hence, program logic 406 may write the partition received through data path 426 to NAND memory 410 through data path 410. In some embodiments, program logic 408 may be configured to write to multiple pages in NAND memory 410 simultaneously. For example, program logic 406 may simultaneously write the partition received through data path 426 to an upper page in NAND memory 410, the partition received through data path 428 to a middle page in NAND memory 410, and the partition received through data path 430 to a lower page in NAND memory 410. It is understood that NAND memory 410 may have any number of pages per wordline, and permutor 418 and program logic 406 may be accordingly configured to rearrange and write the appropriate number of pages.

In FIG. 4, program logic 406 is configured to write to an upper page in NAND memory 410. Accordingly, program logic 406 writes the partition received through data path 426 to NAND memory 410 through data path 408. At a first time, permutor 418 may receive partition 212 through data path 412 and output it through data path 426, may receive partition 232 through data path 414 and output it through 428, and may receive partition 252 through data path 416 and output it through data path 430. Program logic 406 may write partition 212 received through data path 426 to NAND memory 410 through data path 408. At a second time, permutor 418 may receive partition 214 through data path 412 and output it through data path 430, may receive partition 234 through data path 414 and output it through 426, and may receive partition 254 through data path 416 and output it through data path 428. Program logic 406 may write partition 234 received through data path 426 to NAND memory 410 through data path 408. At a third time, permutor 418 may receive partition 216 through data path 412 and output it through data path 428, may receive partition 236 through data path 414 and output it through 430, and may receive partition 256 through data path 416 and output it through data path 426. Program logic 406 may write partition 256 received through data path 426 to NAND memory 410 through data path 408. At a fourth time, permutor 418 may receive partition 222 through data path 412 and output it through data path 426, may receive partition 242 through data path 414 and output it through 428, and may receive partition 262 through data path 416 and output it through data path 430. Program logic 406 may write partition 222 received through data path 426 to NAND memory 410 through data path 408.

At a fifth time, permutor 418 may receive partitions 224, 244, and 264 and rearrange them. Program logic 406 may write one of these partitions to the available space 432 in NAND memory 410. At a sixth time, permutor 418 may receive partitions 226, 246, and 266 and rearrange them. Program logic 406 may write one of these partitions to the available space 434 in NAND memory 410.

In some embodiments, permutor 418 may be a cyclic shifter. A cyclic shifter is configured such that it may shift all received partitions in the same direction one position away from their original position. For example, a cyclic shifter may shift the partition received on data path 412 to data path 428, the partition received on data path 414 to data path 430, and the partition received on data path 416 to data path 426. A cyclic shifter may not, unlike permutor 418, rearrange the positions of the partitions in any permutation. For example, a cyclic shifter may not, but permutor 418 may, rearrange the data received on data path 412 to data path 430, the partition received on data path 414 to data path 428 and the partition received on data path 416 to data path 426.

In some embodiments, the RBER of multiple pages of NAND memory 410 may be almost equal. In this situation, it may be beneficial to store multiple partitions of the same codeword in the same page of NAND memory 410. Doing so will not adversely affect the RBER associated with all the codewords and will reduce the number of pages that need to be accessed read all partitions that made up a complete codeword. This could lead to faster read times and less commands being needed to read a complete codeword. In some embodiments, this may require permutor 418 to not be a cyclic shifter, as a cyclic shifter may not be able to store the partitions in the appropriate locations.

An advantage of using permutor 418 as shown in FIG. 4 is that the ECU does not need to perform any reformatting, or perform multiple transfers for a single codeword. A disadvantage is that permutor 418 and its associated commands will need to be implemented in the circuitry associated with NAND memory 410.

Figure 5:
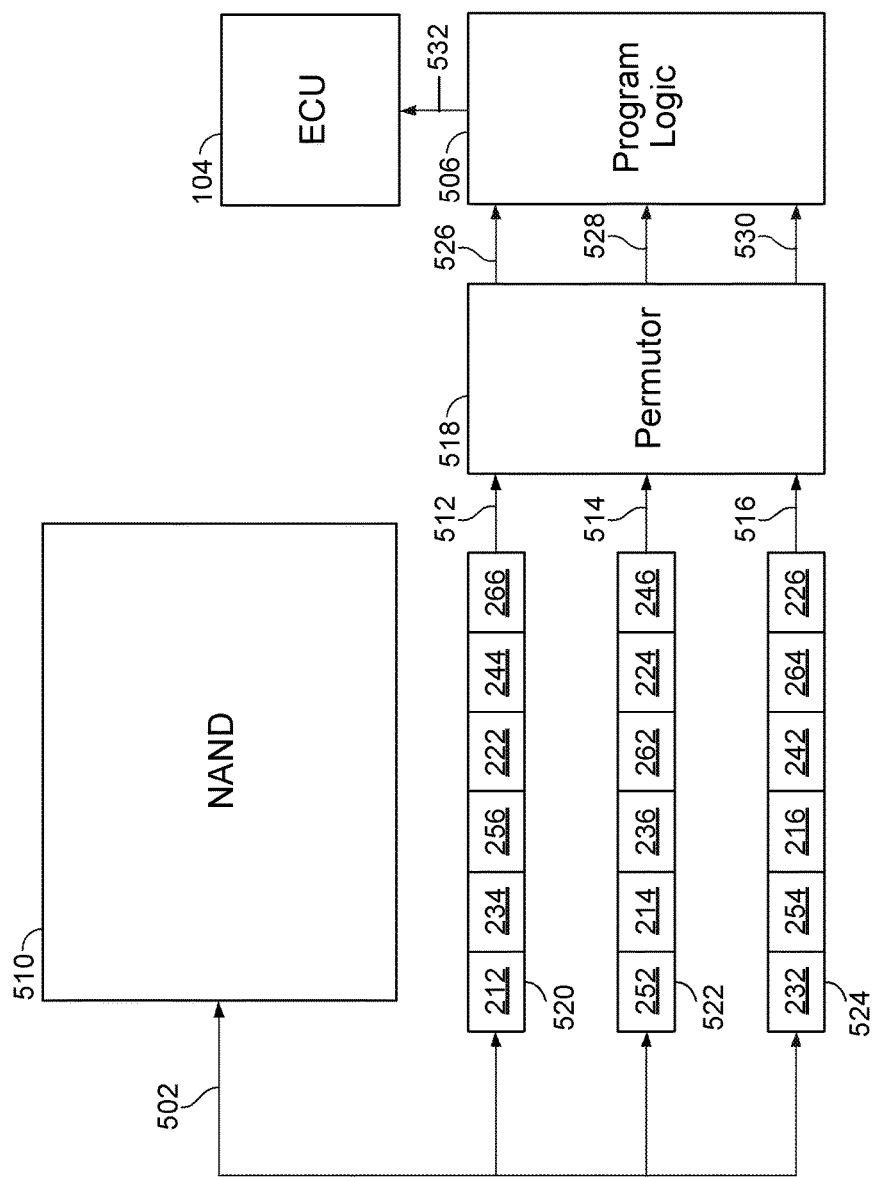
FIG. 5 shows a read operation comprising a transfer of codewords from NAND memory to an Error Correcting Unit using a permutor, in accordance with an embodiment of the present disclosure.

FIG. 5 shows a read operation comprising transfer of codewords from NAND memory 510 to ECU 104 using permutor 518, in accordance with an embodiment of the present disclosure. Codewords stored in NAND memory using permutor 418 as described in relation to FIG. 4 may be read using the embodiment illustrated in FIG. 5. In some embodiments, permutor 518 used to transfer codewords from NAND memory 510 may be the same as permutor 418 used to transfer codewords to NAND memory 410. Partitions stored in NAND memory 510 may be transferred from an upper page, a middle page, and a lower page to buffers 520, 522, and 524 respectively using data path 502.

At a first time, permutor 518 may receive partition 212 from buffer 520 through data path 512, partition 252 from buffer 522 through data path 514, and partition 232 from buffer 524 through data path 516. Permutor 518 may output partition 212 through data path 526, partition 252 through data path 528, and partition 232 through data path 530. Program logic 508 may output partition 212 received through data path 526 to ECU 104 through data path 532. Data paths 526, 528, 530, and 532 may be part of NFIF 112.

Similarly, at a second time, permutor 518 may receive partition 234 from buffer 520 through data path 512, partition 214 from buffer 522 through data path 514, and partition 254 from buffer 524 through data path 516. Permutor 518 may output partition 234 through data path 526, partition 214 through data path 528, and partition 254 through data path 530. Program logic 508 may output partition 214 received through data path 526 to ECU 104 through data path 532. Similarly, at a third time, permutor 518 may receive partition 256 from buffer 520 through data path 512, partition 236 from buffer 522 through data path 514, and partition 216 from buffer 524 through data path 516. Permutor 518 may output partition 256 through data path 526, partition 236 through data path 528, and partition 216 through data path 530. Program logic 508 may output partition 216 received through data path 526 to ECU 104 through data path 532. ECU 104 may reformat received partitions 212, 214, and 216 into codeword 210. ECU 104 may receive the other codewords in a similar manner.

In some embodiments, program logic 506 may transfer three partitions to ECU 104 simultaneously. For example, partitions received through data paths 526, 528, and 530 may be transferred to ECU 104 at the same time through data path 532. In some embodiments, partitions stored in a different layout in NAND memory 510 may be rearranged differently using permutor 518. For example, if partitions 212, 214, and 216 of codeword 210 are stored in two pages of NAND memory 510 instead of three pages, permutor 518 may rearrange them so program logic 506 receives partition 212 at a first time through data path 526, partition 214 at a second time through data path 528, and partition 216 at a third time through data path 530.

Figure 6:
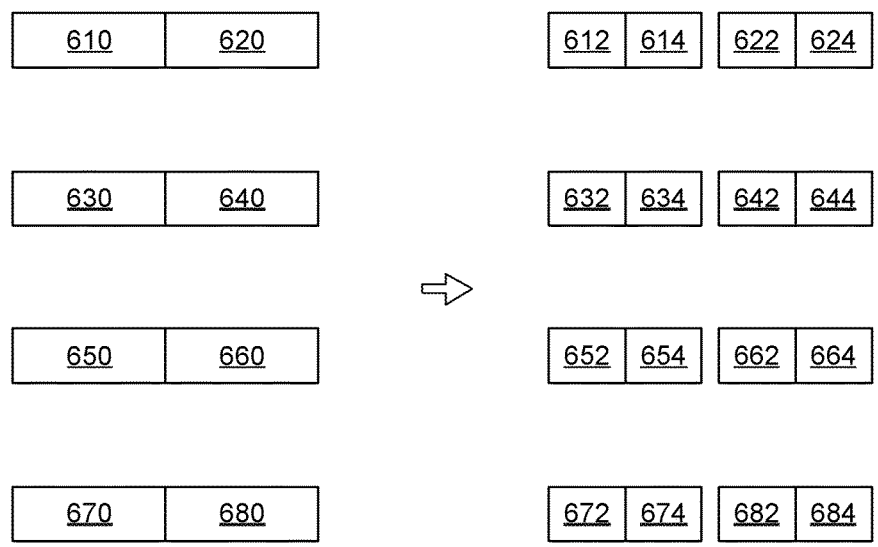
FIG. 6 shows eight codewords reformatted into two partitions each, in accordance with an embodiment of the present disclosure.

FIG. 6 shows eight codewords reformatted into two partitions each, in accordance with an embodiment of the present disclosure. The reformatting may be similar to that described in relation to FIG. 2. In some embodiments, codewords may be reformatted into partitions so that partitions of a codeword can be stored in pages of different wordlines of the same block, or in pages of different blocks of the same plane, or in pages of different planes of the same Logical Unit Number (LUN), or in pages of the different LUNs in the same target. Any embodiments of storing codewords or partitions described in this disclosure can be generalized for these purposes.

An advantage of storing partitions of a codeword in different pages of the different locations described above is that read time may be reduced due to the possible parallelization of reads. For example, codeword 610 may be reformatted into partitions 612 and 614. Partitions 612 and 614 may be stored in different planes of the same LUN. Reading codeword 610 may include reading partitions 612 and 614 from their respective planes simultaneously. Hence, reading codeword 610 in this situation may take less time than reading partitions 612 and 614 from the same plane sequentially.

Codeword 610 has been reformatted into partitions 612 and 614. Codeword 620 has been reformatted into partitions 622 and 624. Codeword 630 has been reformatted into partitions 632 and 634. Codeword 640 has been reformatted into partitions 642 and 644. Codeword 650 has been reformatted into partitions 652 and 654. Codeword 660 has been reformatted into partitions 662 and 664. Codeword 670 has been reformatted into partitions 672 and 674. Codeword 680 has been reformatted into partitions 682 and 684.

Figure 7:
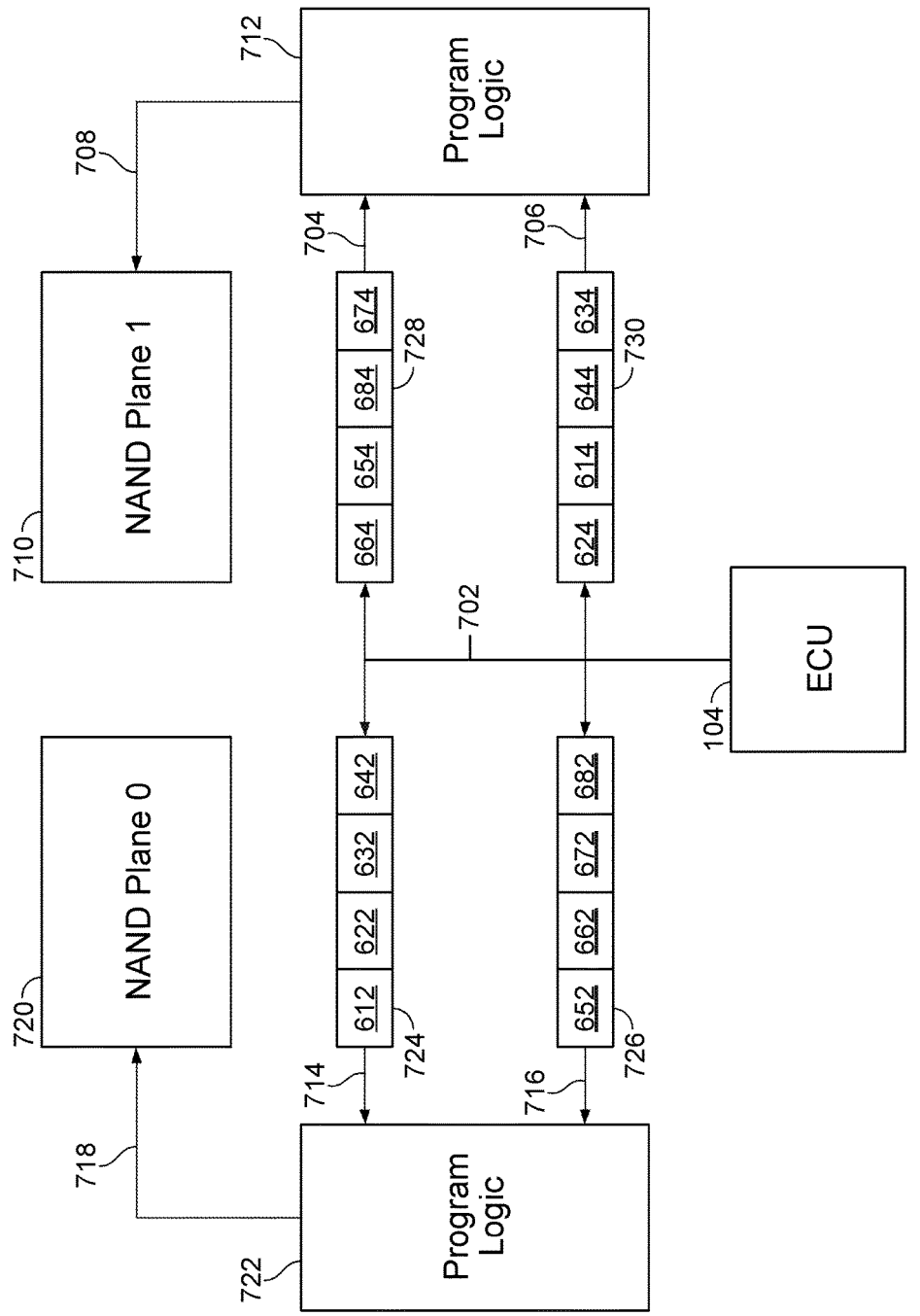
FIG. 7 shows a transfer of codewords from an Error Correcting Unit to pages of different NAND planes of the same Logical Unit Number, in accordance with an embodiment of the present disclosure.

FIG. 7 shows a transfer of codewords from ECU 104 to pages of different NAND planes 710 and 720 of the same LUN, in accordance with an embodiment of the present disclosure. Each NAND plane may be associated with two page buffers. For example, NAND plane 710 has two page buffers 728 and 730. NAND plane 720 has two page buffers 724 and 726. ECU 104 may have direct access to the page buffers. Although NAND planes 710 and 720 are shown as having two page buffers and two pages for each wordline, a NAND plane may have any number of page buffers and pages for each wordline. For example, a NAND plane may have three page buffers and three pages per wordline. Codewords may also be stored across any number of NAND planes using the embodiments described in this disclosure.

Codewords may be stored such that a first partition is stored in the lower page of a wordline of one plane, while a second partition is stored in the upper page of the same wordline of the other plane. Although codewords with two partitions and wordlines with two pages are discussed here, codewords may be reformatted into any number of partitions and wordlines may have any number of pages. For example, codewords may be reformatted into three partitions each and wordlines may have three pages. In some embodiments of this example, a first partition of the codeword may be stored in an upper page of a wordline in one plane, while second and third partitions may be stored in a middle and lower page respectively of the same wordline in the other plane. In some embodiments of this example, a first partition of the codeword may be stored in an upper page of a wordline in one plane, while second and third partitions may be stored in a lower page of the same wordline in the other plane.

Codewords 610, 620, 630, and 640 are transferred from ECU 104 to buffers 724, 726, 728, and 730 using data path 702. Each codeword is reformatted into two partitions each, as described in relation to FIG. 6. These codewords are stored so that a first partition is stored in the upper page of a wordline in one plane, and a second partition is stored in the lower page of the same wordline in the other plane. For example, codeword 610 is stored such that partition 612 is in upper page buffer 724 of NAND plane 720 and partition 614 is in lower page buffer 730 of NAND plane 710. Similarly, codeword 620 is stored such that partition 622 is in upper page buffer 724 of NAND plane 720 and partition 624 is in lower page buffer 730 of NAND plane 710. Similarly, codeword 630 is stored such that partition 632 is in upper page buffer 724 of NAND plane 720 and partition 634 is in lower page buffer 730 of NAND plane 710. Finally, codeword 640 is stored such that partition 642 is in upper page buffer 724 of NAND plane 720 and partition 644 is in lower page buffer 730 of NAND plane 710. Codewords 650, 660, 670, and 680 are stored such that partitions 652, 662, 672, and 682 are stored in lower page buffer 726 of NAND plane 720 and partitions 654, 664, 674, and 684 are stored in upper page buffer 728 of NAND plane 710.

After codewords 610, 620, 630, 640, 650, 660, 670, and 680 have been transferred from ECU 104 to buffers 724, 726, 728, and 730 using data path 702, they can be transferred into NAND planes 710 and 720. Partitions from buffer 724 may be transferred to program logic 722 using data path 714, and partitions from buffer 726 may be transferred to program logic 722 using data path 716. Similarly, partitions from buffer 728 may be transferred to program logic 712 using data path 704, and partitions from buffer 730 may be transferred to program logic 712 using data path 706. In some embodiments, program logic 722 may transfer the contents of the buffers 724 and 726 to NAND plane 720 using data path 718 simultaneously, so that the contents of buffer 724 are stored in an upper page of a wordline in NAND plane 720 and contents of buffer 726 are stored in a lower page of the same wordline in NAND plane 720. In some embodiments, program logic 722 may transfer the contents of buffers 724 and 726 one at a time to NAND plane 720 using data path 718, so that contents of buffer 724 are stored in an upper page of a wordline in NAND plane 720 and contents of buffer 726 are stored in a lower page of the same wordline in NAND plane 720. Contents of buffers 728 and 730 may be transferred to NAND plane 710 using data path 708 in a similar manner, so that they are stored in a wordline in NAND plane 710 that corresponds to the wordline in NAND plane 720 that contains the contents of buffers 724 and 726.

In some embodiments, buffers 724 and 728 may be extra page buffers, while buffers 726 and 730 are page registers. In some embodiments, NAND plane 710 and NAND plane 720 may have their own page registers 730 and 726 respectively, but they may share an extra page buffer. In this situation, ECU 104 may transfer the contents of an upper page of one plane to the extra buffer, while the contents of a lower page of the other plane are being transferred from its page register to the other plane. In some embodiments, NAND plane 710 and NAND plane 720 may have their own page registers 730 and 726 respectively, and not have any extra buffers. In this situation, page registers 730 and 726 may be able to transfer contents between each other, and may act as extra buffers for each other.

Figure 8:
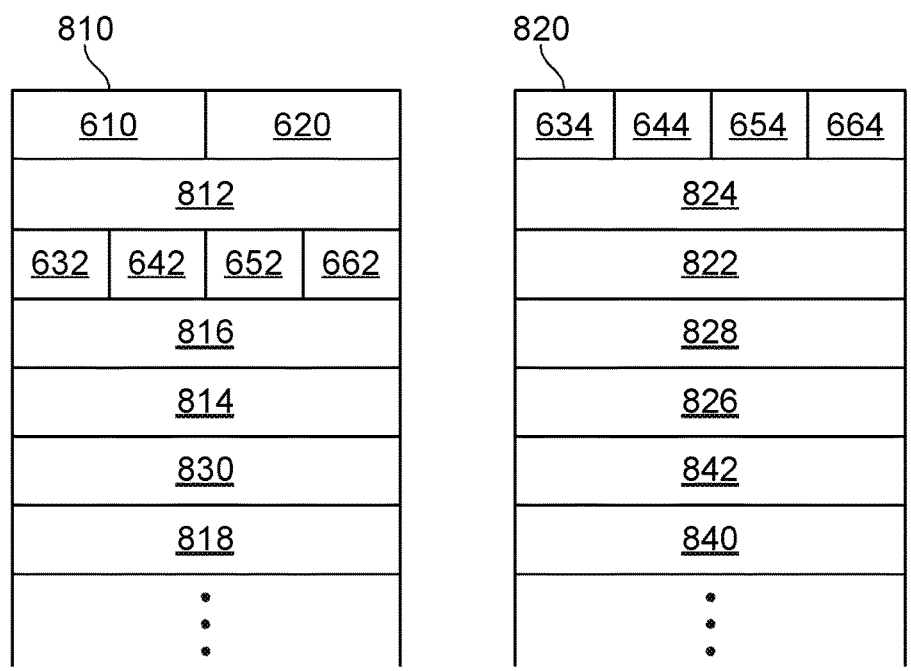
FIG. 8 shows partitions of codewords interleaved across NAND planes belonging to different LUNs in the same target, in accordance with an embodiment of the present disclosure.

FIG. 8 shows partitions of codewords interleaved across NAND planes 810 and 820 belonging to different LUNs in the same target, in accordance with an embodiment of the present disclosure. Each LUN in FIG. 8 has two planes, although it is understood that an LUN may have any number of planes. NAND plane 810 is part of a first LUN while NAND plane 820 is part of a second LUN. NAND plane 810 has two pages for each wordline. For example, upper page 816 and lower page 814 form a wordline, and upper page 830 and lower page 818 form another wordline. Similarly, NAND plane 820 has two pages for each wordline. For example, upper page 828 and lower page 826 form a wordline, and upper page 842 and lower page 840 form another wordline. NAND planes 810 and 820 may be associated with their own program logic controllers.

Interleaving codewords across NAND planes 810 and 820 may begin with storing entire codewords 610 and 620 as shown in FIG. 8. Next, partitions of codewords 630, 640, 650, and 660 may be stored so that the first partition of these codewords is stored in NAND plane 810 and the second partition of these codewords is stored in NAND plane 820, as shown in FIG. 8. Similarly, a set of codewords might be stored so that their first partitions are in location 812 and their second partitions are in location 822. Another set of codewords might be stored so that their first partitions are in location 814 and their second partitions are in location 824. Another set of codewords might be stored so that their first partitions are in location 816 and their second partitions are in location 826. Another set of codewords might be stored so that their first partitions are in location 818 and their second partitions are in location 828. Another set of codewords might be stored so that their partitions are in locations 830 and 840. The interleaving process may end by storing two entire codewords in the last page of NAND plane 820.

Figure 9:
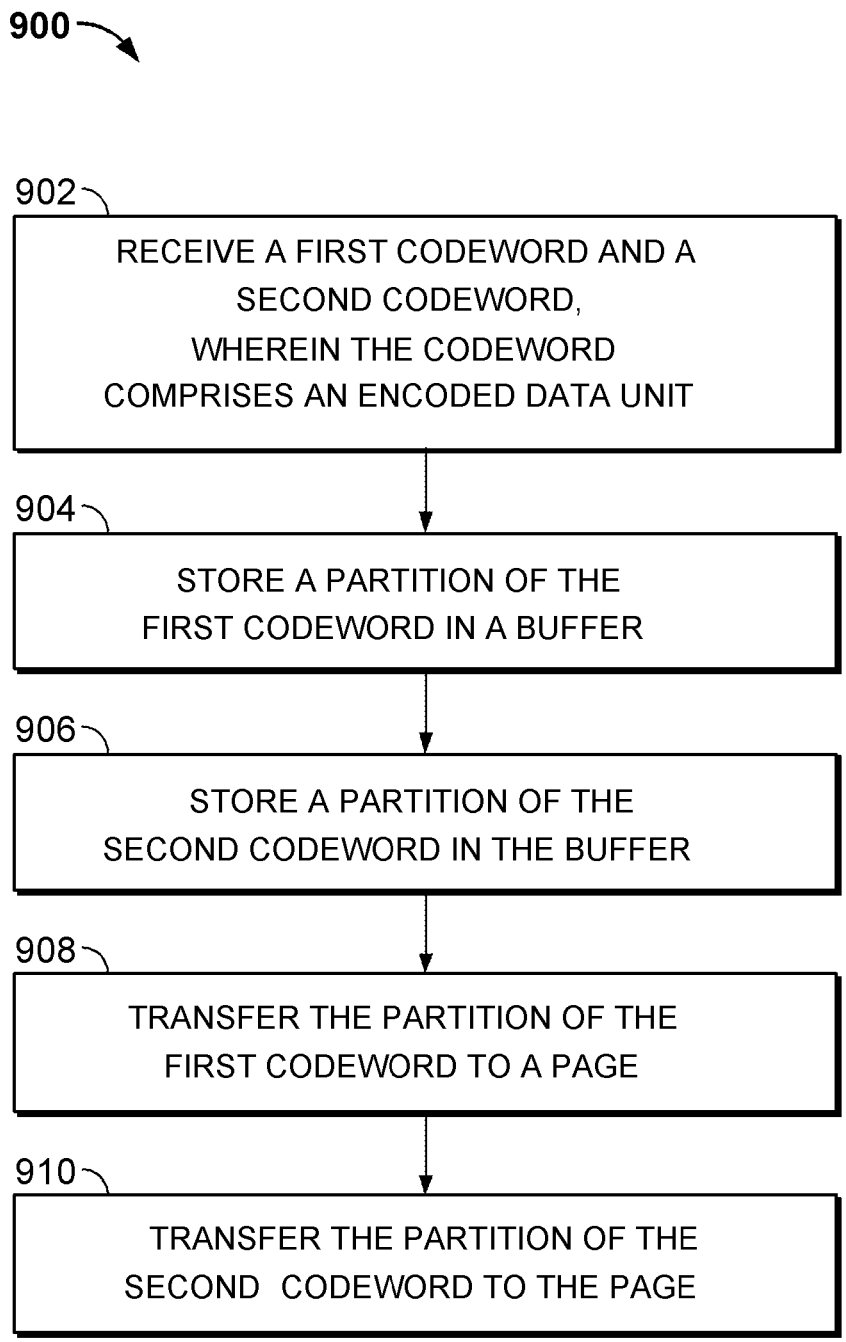
FIG. 9 shows a flow diagram of a process for storing codewords in NAND memory, in accordance with an embodiment of the present disclosure.

FIG. 9 shows a flow diagram of a process for storing codewords in NAND memory, in accordance with an embodiment of the present disclosure. Process 900 begins at 902 by receiving a first codeword and a second codeword from an Error Correction Unit, wherein the codeword comprises an encoded data unit. The codewords may have been created by LDPC 104 in ECU 104. For example, the codewords may be received from ECU 104 using NFIF 112 or the data paths described in location with FIGS. 3-5 and 7. In some embodiments, the codewords received may already have been reformatted into partitions.

Process 900 progresses to 904 by storing a partition of the first codeword in a buffer. The partition of the first codeword may be created through the reformatting described in relation to FIGS. 2 and 6. For example, ECU 104 may store a first partition of a first codeword in a first buffer, and a second partition of the first codeword in a second buffer. The storage of the partitions in the buffers may be temporary, as the buffers may only hold the data until it can be transferred to NAND memory. In another example, chopping logic controller 304 may store a first partition of a first codeword in a first buffer, and a second partition of the first codeword in a second buffer. In some embodiments, a second partition of the first codeword may also be stored in the buffer. Any embodiment described in relation to FIGS. 3-5 and 7 may be used to store the partition of the first codeword in the buffer.

Process 900 progresses to 906 by storing a partition of the second codeword in the buffer. This may happen in the same manner as described in relation with 904.

Process 900 progresses to 908 by transferring the partition of the first codeword to a page. For example, program logic 318 or 406 may be used to transfer the contents of the buffer to the page. In some embodiments, permutor 418 may be used to transfer the partition of the first codeword to the page as described in relation to FIG. 4. The transfer process may occur as described in relation to any of the embodiments from FIGS. 3-5 and 7.

Process 900 progresses to 910 by transferring the partition of the second codeword to the page. This may happen in the same manner as described in relation to 910.

While various embodiments of the present disclosure have been shown and described herein, it will be obvious to those skilled in the art that such embodiments are described by way of example only. Numerous variations, changes, and substitutions will now occur to those skilled in the art without departing from this disclosure. It should be understood that various alternatives to the embodiments of the disclosure described herein may be employed in practicing the disclosure. It is intended that the following claims define the scope of the disclosure and that methods and systems within the scope of these claims and their equivalents be covered thereby.

What is claimed is:

1. A method for storing codewords in NAND memory comprising:
   receiving a first codeword and a second codeword for storage at a NAND memory having a first page and a second page, wherein the first page is associated with a first error rate for storing data and the second page is associated with a second error rate, and the first error rate is higher than the second error rate;
   reformatting, by a chopping logic controller, coupled to a plurality of parallel buffers, prior to sending the first codeword and the second codeword to the NAND memory, the first codeword into at least a first part and a second part, and the second codeword into at least a third part and a fourth part, without changing content of the first codeword or the second codeword, each part being sized such that each page in the NAND memory is capable of storing multiple parts;
   selecting a first buffer from the plurality of parallel buffers that are connected to the NAND memory via a single data path, the first buffer being designated only for the first page to store the first part of the partitioned first codeword and the third part of the partitioned second codeword;
   selecting a second buffer that is parallel to the first buffer and is designated only for the second page to store the second part of the partitioned first codeword and the fourth part of the partitioned second codeword;
   generating, by the chopping logic controller, an output layout including the partitioned first codeword and the partitioned second codeword for transmission into the first buffer and the second buffer, respectively; and
   transferring, via the single data path, stored data from the parallel first buffer designated only for the first page and the second buffer designated only for the second page to the first page having the first error rate and the second page having the second error rate lower than the first error rate, respectively.

2. The method of claim 1, wherein receiving the first codeword and the second codeword further comprises receiving the first codeword and the second codeword at an extra buffer.

3. The method of claim 1, wherein transferring the first part of the partitioned first codeword to the first page further comprises:
   transferring the first part of the partitioned first codeword from the buffer to a permutor;
   shifting a position of the first part of the partitioned first codeword in the permutor; and
   transferring the first part of the partitioned first codeword from the permutor to the first page.

4. The method of claim 3, wherein the permutor is a cyclic shifter.

5. The method of claim 1, further comprising selecting the first page or the second page using program logic.

6. The method of claim 1, further comprising:
   determining the first error rate of the first page is almost equal to the second error rate of the second page; and
   in response to the determining, transferring the second part of the partitioned first codeword to the first page.

7. The method of claim 1, further comprising transferring the first part of the first codeword from the first page to an error correction unit.

8. The method of claim 1, further comprising storing the second part of the partitioned first codeword in the second page in a second plane of the NAND memory.

9. The method of claim 1, wherein the first page is associated with a first logical unit number, and further comprising storing the second part of the partitioned first codeword in the second page in a second logical unit number.

10. A system for storing codewords in NAND memory comprising:
- a NAND memory having a first page associated with a first error rate for storing data and a second page associated with a second error rate for storing data, the NAND memory being configured to receive a first codeword and a second codeword, wherein the first error rate is higher than the second error rate;
- a plurality of parallel buffers connecting to the NAND memory via a single data path, each buffer from the plurality of parallel buffers being designated to a corresponding page in the NAND memory;
- a chopping logic controller, coupled to the plurality of parallel buffers, being configured to receive and reformat the first codeword into at least a first part and a second part, and the second codeword into at least a third part and a fourth part, without changing content of the first codeword or the second codeword, each part being sized such that each page in the NAND memory is capable of storing multiple parts;
- the plurality of parallel buffers including a first buffer designated only for the first page to store the first part of the partitioned first codeword and the third part of the partitioned second codeword, and
  - a second buffer that is parallel to the first buffer and is designated only for the second page to store the third part of the partitioned first codeword and the fourth part of the partitioned second codeword;
- the chopping logic controller being configured to generate an output layout to transfer the partitioned first codeword and the partitioned second codeword into the first buffer and the second buffer, respectively; and
- the first buffer designated only for the first page and the second buffer designated only for the second page being configured to transfer, via the single data path, stored data to the first page having the first error rate and the second page having the second error rate lower than the first error rate in the NAND memory, respectively.

11. The system of claim 10, wherein the control circuitry is configured to receive the first codeword and the second codeword is further configured to receive the first codeword and the second codeword at an extra buffer.

12. The system of claim 10, wherein the control circuitry is further configured to:
- transfer the first part of the partitioned first codeword from the buffer to a permutor;
- shift a position of the first part of the partitioned first codeword in the permutor; and
- transfer the first part of the partitioned first codeword from the permutor to the first page.

13. The system of claim 12, wherein the permutor is a cyclic shifter.

14. The system of claim 10, wherein the control circuitry is further configured to select the first page or the second page using program logic.

15. The system of claim 10, wherein the control circuitry is further configured to:
- determine the first error rate of the first page is almost equal to the second error rate of the second page; and
- in response to the determining, transfer the second part of the partitioned first codeword to the first page.

16. The system of claim 10, wherein the control circuitry is further configured to transfer the first part of the first codeword from the first page to an error correction unit.

17. The system of claim 10, wherein the control circuitry is further configured to store the second part of the partitioned first codeword in the second page in a second plane of the NAND memory.

18. The system of claim 10, wherein the first page is associated with a first logical unit number, and wherein the control circuitry is further configured to store the second part of the partitioned first codeword in the second page in a second logical unit number.

* * * * *